June 20, 1961 S. S. ROMANO ET AL 2,989,705

PRINTED CIRCUIT HUM CONTROL

Filed Dec. 31, 1956 2 Sheets-Sheet 1

INVENTORS.
Sam S. Romano
Rudolph R. Starai
BY Watson D. Harbaugh
Atty.

June 20, 1961 S. S. ROMANO ET AL 2,989,705

PRINTED CIRCUIT HUM CONTROL

Filed Dec. 31, 1956 2 Sheets-Sheet 2

INVENTORS.
Sam S. Romano
Rudolph R. Starai
BY Watson D. Harbaugh
Atty.

United States Patent Office 2,989,705
Patented June 20, 1961

2,989,705

PRINTED CIRCUIT HUM CONTROL

Sam S. Romano, North Lake, and Rudolph R. Starai, Chicago, Ill., assignors to Webcor, Inc., a corporation of Illinois Filed Dec. 31, 1956, Ser. No. 631,908
7 Claims. (Cl. 330—149)

This invention relates to a printed wire circuit, and more especially to a noise or hum control arrangement for printed wire circuits. The invention and circuits incorporating the same are useful in a variety of applications, such as recorders, disc and tape record players, radios, television, etc.

In every electric circuit that has an alternating current component, a considerable amount of noise is inherent therein; that is, the alternating current creates an interference imposed on the circuit and the "tonal" value of the interference or noise is equal to the frequency of the alternating current component and harmonics thereof. This noise or interference is noticeable when it occurs at a frequency within the audible range and where the purpose of the circuit is to produce audible tones for the human ear. It can also appear as a visual interference on television receiver screens, for example. The most commonly encountered source of such noise is the 60-cycle hum, and the audible harmonics thereof, resulting from the 60-cycle power sources in extensive use today. This 60-cycle current is present in the power packs for the electric circuits, and ordinarily is used directly throughout such circuits for the filaments of the tubes employed therein.

Though creating somewhat of a problem in all circuits, this hum is particularly undesirable in printed wire circuits because in that environment where the leads may be circuitous to reach where they are going around other wires of the filament circuits and are close to signal carrying wires integral with the board or panel. The noise or hum seems to be transferred into the panel through capacitance and inductance and carried by it to all parts of the circuit and component parts thereof and thereby amplifying this annoying interference in the signal output of the circuit. It will be apparent that the performance of printed wire circuits could be substantially improved if some means were provided for suppressing or controlling this noise or hum, and the provision of such a means is an object of this invention.

Another object of the invention is to provide an arrangement for controlling or suppressing interference or noise in an electric circuit, such as the 60-cycle hum and harmonics thereof inherent in the alternating current power sources generally employed with electric circuits. Still another object is in the provision of means for substantially decreasing the level of noise present in the leads and components of a printed wire circuit. Yet another object is that of incorporating impedance in the power and ground circuits of a printed wire board, of sufficient value and at such location that hum inherent in or created by the power supply is compensated and thereby attenuated and dampened.

A further object of this invention is to equip a critical portion of a printed wire board or panel with an elongated ground circuit extending generally thereabout, and to interrupt that elongated circuit at at least one point therealong whereby it is discontinuous, and to bridge a portion of the ground circuit where it is proximate to the grid circuit of the first amplifying tube with the A.C. component causing noise or hum, in a manner such that the counterphase of said component can be fed to the dominant portion of the ground circuit to compensate or counter-balance the noise or hum-creating component normally present therein, with the result that such hum is minimized. Yet a further object is to provide an arrangement of the type just described, wherein the A.C. component is fed to a portion of the ground circuit (which preferably extends perimetrically about the printed wire panel) through an adjustable or selected impedance (preferably resistance elements) whereby the value of the counter-balancing or compensating A.C. component can be selectively adjusted to maximize the hum control characteristics thereof. Additional objects and advantages will become apparent as the description proceeds.

An embodiment of the invention is illustrated in the accompanying drawings, in which.

Figure 1:
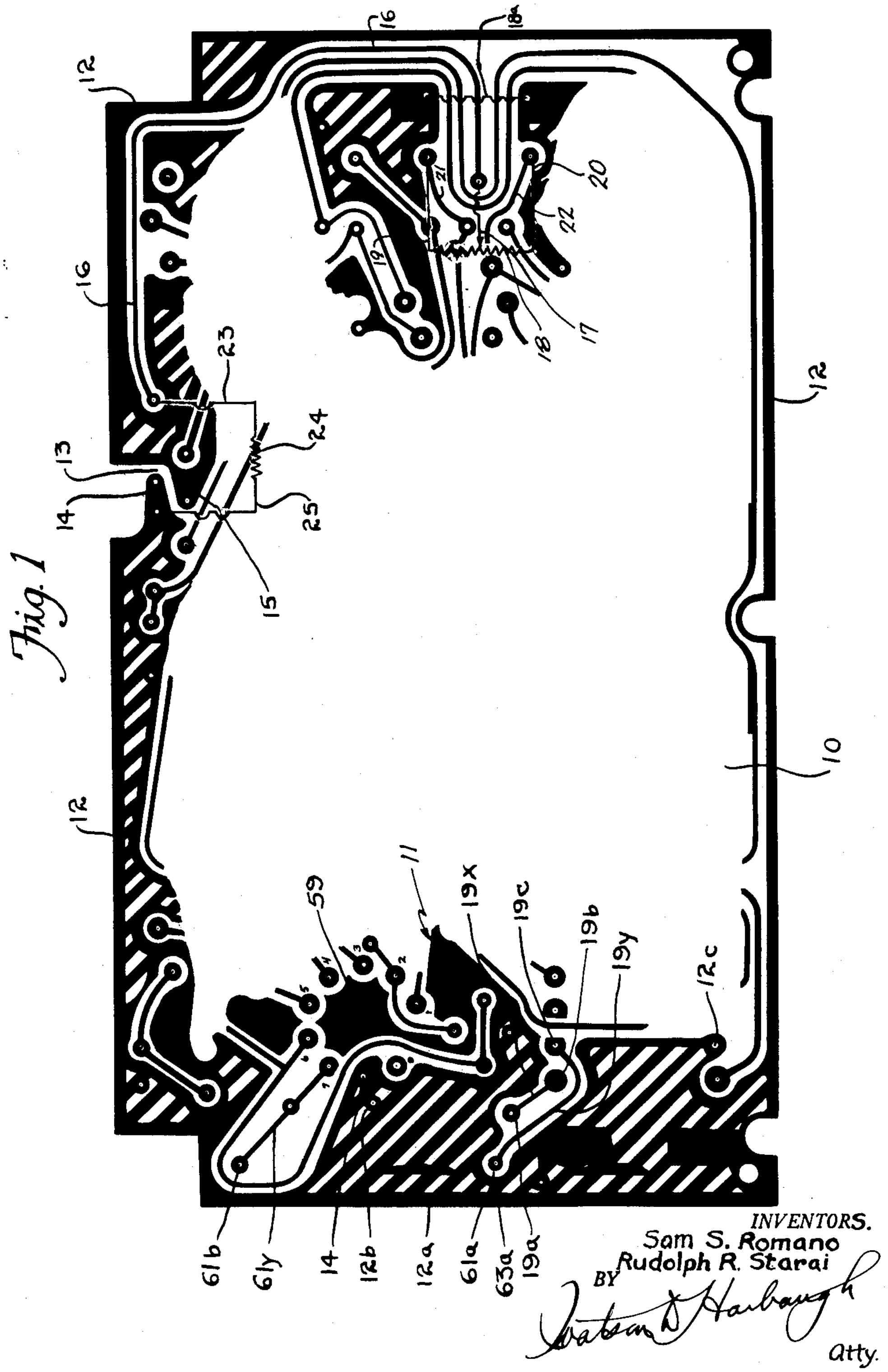
FIG. 1 is a top plan view looking through the insulating board of a printed wire panel equipped with the invention, but in which a substantial portion of the printed wires thereon have been omitted for purposes of simplicity.

The printed wire circuit illustrated in FIG. 1 comprises a panel designated with the numeral 10, and the panel is provided with a plurality of printed wires that in their entirety are designated with the numeral 11. The panel 10 may be conventional, and will be formed of the usual insulating material. Also, the printed wires 11 may be formed on the panel or board 10 in any desired manner, such as by any of the well known techniques which form no part of this invention and need not be discussed. It will be noted that one of the wires of the group 11 extends substantially perimetrically about the panel, and it is designated for identification with the numerals 12 and **12*a***.

The perimetric printed wire 12 and **12*a* in this illustration forms a ground wire or ground circuit having an impedance due to connector cross section design, and it is seen to be interrupted, having a separation therein as is shown at 13. In the area of the break 13, one leg of the ground wire is provided with a reduced extension 14 extending toward the right (as viewed in FIG. 1), while the other leg is provided with a reduced extension 15 that extends toward the left. The extensions 14 and 15 are arranged in spaced apart, overlapping relation, the spacing therebetween forming a part of the separation 13**.

Figures 2, 3:
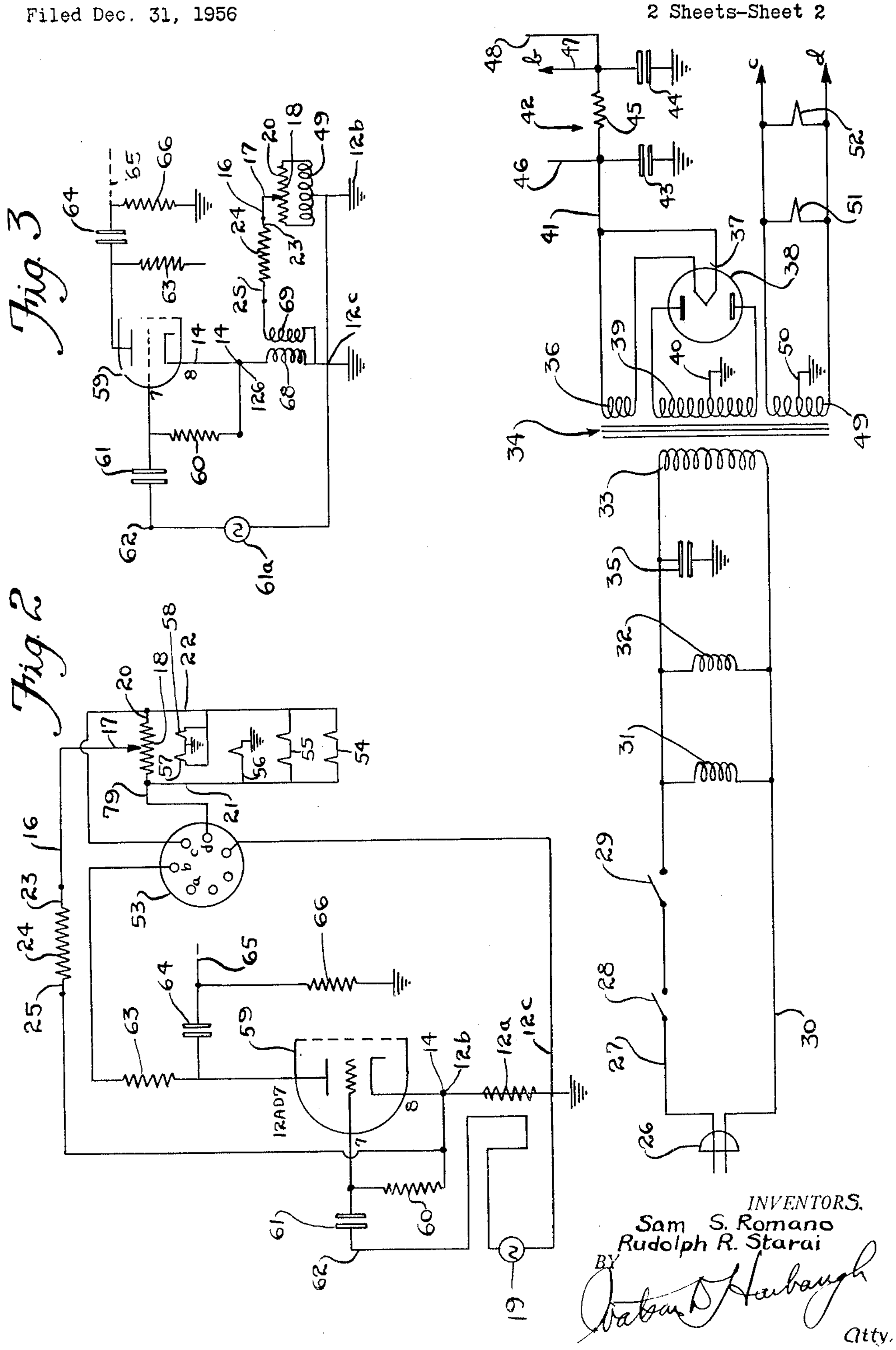
FIG. 2 is a schematic circuit diagram which is the equivalent of the printed wire circuit illustrated in FIG. 1, and in which portions of the total printed circuit have again been omitted for purposes of simplifying the illustration.
FIG. 3 is a modification of the circuit shown in FIG. 2 in which the counter-balancing component is applied through isolation circuits.

The panel 10 is also seen to have a printed wire 16 thereon that runs generally along the ground wire **12*a* for a distance equal to about one quadrant along the rectangular pane 10. As will be brought out in greater detail hereinafter when the schematic diagram of FIG. 2 is discussed, the printed wire 16 at one end thereof is connected through the adjustable tap 17 of a potentiometer 18 to a circuit having a counter hum current component therein through the leads 19 and 20 that connect, respectively, to printed wires 21 and 22. At its opposite end, the wire 16 is connected through lead 23 to a fixed current limiting resistance 24 of approximately 1 megohm, which has its other lead 25 connected to the extension 14 of the ground circuit wire 12. The body of the potentiometer is grounded as indicated at 18*a*** when it serves as a connector for two ground portions of the panel.

Referring now to FIG. 2, that portion of the circuit shown includes all of the pertinent printed wires, leads and components heretofore described, and in addition shows portions germane to this disclosure for use as a record player circuit. In order to facilitate an understanding of the invention, the portions of the circuit disclosed will be described briefly.

The power input for the circuit comes in through a plug 26 adapted to be inserted into a convenience outlet that supplies a 60-cycle alternating current power. One side of the plug 26 may be connected through a lead 27 to a manually operable on-off switch 28 having in series therewith a switch 29 that may be associated with the record player in a manner such that the device is automatically turned off after a predetermined cycle of operation. The other side of the plug is connected to a lead 30, and connected across the leads 27 and 30 are motors illustrated by the windings or coils 31 and 32 which may constitute in part hum interference generators. Also connected across the input leads 27 and 30 is the primary winding 33 of a power transformer designated generally with the numeral 34 which also can be a source of hum. Preferably, a capacitance 35 is connected between ground and the lead 27, and it serves as a conventional line filter.

The transformer 34 has a step-down secondary winding 36 that supplies the filaments 37 of a duo diode power tube 38, the anodes of which are connected to a secondary winding 39 that is grounded through a center tap 40. One side of the filaments 37 is connected through a lead 41 to a filter designated generally with the numeral 42, which in the illustration comprises capacitors 43 and 44 and a resistance 45. D.C. power for the tubes, etc. in the circuit is taken from the filter 42 at appropriate points therealong giving the desired voltage values, such as the leads 46, 47 and 48.

The power transformer 34 is also seen to have a secondary winding 49 that supplies filament current for the various tubes used in the circuit. The filament winding 49 is grounded through a center tap 50, and connected directly across the winding are filaments 51 and 52. A connector plug 53 may be provided, and it is seen that the secondary filament winding 49 is connected through contacts *c* and *d* thereof to the printed wires 21 and 22 having thereacross filaments 54 and 55. Connected between the wire 21 and ground is a filament 56, and connected between the wire 22 and ground are filaments 57 and 58. It is seen that the variable impedance in the form of the potentiometer 18 in being connected across the printed wires 21 and 22, is connected across the filament transformer winding 49 and thus has an alternating current flowing therethrough. That alternating current, of course, will have the frequency of the power input delivered to the convenience plug 26, and customarily will be 60 cycles.

Also shown is the input section of a duo triode tube 59 having a control grid which through a resistor 60 is connected to the "ground" at 12 and the cathode of the tube is connected to "ground" on the panel at 14. The input lead from the sound generator 19' to the panel is connected into the panel at **19*a*. The wire connection 19*x* from there leads to a switch pole at 19*b* and from the switch (not shown) back into the panel at 19*c*. From this point a wire 19*y* leads to one end 61*a* of the condenser 61. The coupling capacitor 61 is connected to receive audio signals at 19*y* and return them to the panel at 62*b* from which they are conducted to the grid by wire 61*y*. The ground connection 50 from the power chassis (not shown) enters the panel at 12*c* and it will be noted that between the cathode and grid resistor ground connection, indicated in close proximity to each other, and the point 12*c* where the zero ground connection enters the panel, there is a web-shaped section 12*a* of ground wires therebetween and enveloping the grid leads 19*x* and 19*y*. This section 12*a* has a conductor resistance factor of less than one ohm in the embodiment shown, but this can be varied as desired or design requires, so long as the resistance is appreciable. In FIG. 2, this section is represented diagrammatically as a combination conductor and resistor at 12*a***.

The anode of the tube section is connected through a plate load resistance 63 to the terminal B of the plug 53, and through it to the line 47 of the power supply circuit whereby a positive D.C. potential is applied to the tube.

The anode of the tube is also provided with a capacitor 64 for coupling it to subsequent stages (not shown) of the device through the lead 65. Since the subsequent amplifier stages, etc. merely amplify the signal, even though some noise may be picked up here also, their description would serve no purpose to a further understanding of the invention and they are not illustrated in the drawings and will not be described.

It is noted, as described hereinbefore in connection with FIG. 1, that the tap 17 of the potentiometer 18 is connected through the printed wire 16, to the fixed resistance 24 and then to the extension 14 of the ground circuit 12. That extension 14 physically is located adjacent the tube 59, and it will be noted that it connects to the cathode and grid resistance on their end of the section **12*a* of the ground wire 12**.

The circuit is necessarily provided with a plurality of tubes, and these tubes are located at various positions on the panel 10. Thus, rather extensive printed wires are required to carry the filament current supplied by the secondary winding 49 of the power transformer to filaments of these tubes. Therefore, the alternating current component having the power supply frequency—that is, 60 cycles and harmonics thereof—is spread throughout the panel 10 and is present particularly in the portion **12*a*** around the grid of the input tube which is quite sensitive. The hum therein is transmitted by the panel to the various other integral printed wires thereon including the grid connections, whereby this noise or 60-cycle hum (and the audible components) ordinarily tends to be present in the audio circuits that should be free of such noise. It may be noted that this hum or noise in being present in the board itself, also transfers energy at this frequency to the various components mounted on the board, thereby increasing the objectionable noise features along with interelectrode capacitance in the tube itself.

However, with the present invention, these tendencies are compensated or counter-balanced by feeding a controlled hum component to the portion **12*a* of the ground circuit. The magnitude of this component is adjustable by simple selection of the position of the tap 17** of the potentiometer. This permits tailoring of the counter-balancing signal so that hum-minimizing can be brought to its maximum effectiveness.

Another way for feeding this controlled hum component to the portion **12*a* of the ground circuit 12** is shown in FIG. 3 schematically where like numerals refer to like parts.

In this embodiment, the conductor resistance represented by the numeral **12*a* in FIG. 2 is shown as a low impedance coil 68 which has inductively associated therewith another coil 69 connected with the counter hum generator 20. Although it is not necessary to break the circuit portion 12*a* in connecting the coil 68 in place, it is preferred to do so at approximately 63*a*, thus the counter inductivity will be more effectively applied by coil 69 to the path of the ground circuit confined to the coil 68**.

The hum bucking generator which may have any counter noise characteristic required or desired is shown as the assembly of the potentiometer 18 and the filament power coil 49 with the signal picked off by the movable contact 17 which renders the signal variable both as to intensity and phase as imposed upon the conductor portion **12*a***. The counter noise signal therefore can be varied to counteract the noise existing in the amplifier circuits whether it arises in the input circuit, the inter electrode capacitance or includes noise entering the circuit in subsequent stages.

While in the foregoing specification an embodiment of the invention has been described in considerable detail for purposes of making an adequate disclosure thereof, it will be apparent to those skilled in the art that numerous changes may be made in those details without departing from the spirit and principles of the invention.

What is claimed is:

1. In a device of the character described, a printed wire panel including a circuitous ground circuit having a predetermined impedance over a portion of its length, a tube stage having an input grid connection adjacent to said ground circuit portion, a source of alternating current, circuits carrying said alternating current including two conductors connected to opposite sides of said source with a load impedance between them, signal circuits picking up alternating current hum from said conductors, said ground circuit being connected at one end of said portion to said source of alternating current at a point intermediate the sides of said source, circuit means interconnecting one of the sides of said source and the other end of said portion of the ground circuit including a current limiting impedance therein operative to feed an alternating current component of selected phase and amplitude to said ground circuit for induction in said input grid connection in opposition to the alternating current hum picked up by said signal circuits for suppressing same.

2. In a device of the character described, a printed wire panel including a circuitous ground circuit having a predetermined impedance over a portion of its length, a source of alternating current, circuits carrying said alternating current including conductors connected to opposite sides of said source with a load impedance between them, signal amplification circuits associated with said ground circuit and picking up alternating current hum from one of said conductors, said ground circuit being connected at one end of said portion to said source of alternating current, circuit means connecting the other end of said portion of the ground circuit to a selected side of said source including a current limiting impedance operative to feed an alternating current component of selected phase and amplitude to said portion of said ground circuit in opposition to the alternating current hum picked up by said signal circuits for suppressing the same.

3. The device of claim 2 in which said additional circuit means comprises a printed wire extending along said ground circuit for a substantial distance on said panel.

4. The device of claim 2 in which said additional circuit means comprises an adjustable impedance connected therein.

5. In a device of the character described, a printed wire panel including a circuitous ground circuit having a predetermined impedance over a portion of its length, a source of alternating current, circuits carrying said alternating current including two conductors connected to opposite sides of said source with a load impedance between them, signal circuits associated with said ground circuit and picking up alternating current hum from said conductors, said ground circuit being connected at one end of said portion to said source of alternating current at a point intermediate the sides of said source, a variable resistance device interconnecting the sides of said source and having a movable contact, circuit means connecting said movable contact to the other end of said portion of the ground circuit, said circuit means having a current limiting resistance therein and being operative to feed an alternating current component of selected phase and amplitude to said ground circuit in opposition to the alternating current hum picked up by said signal circuits for suppressing the same.

6. The device of claim 5 in which said predetermined impedance portion and said circuit means include the windings of a transformer.

7. The device of claim 5 in which said panel is generally rectangular, and in which said portion printed ground circuit is disposed in proximity to one of said signal circuits comprising the grid lead of an input tube.

References Cited in the file of this patent

UNITED STATES PATENTS

| | | |
|---|---|---|
| 1,630,346 | Latour | May 31, 1927 |
| 2,206,638 | Koch | July 2, 1940 |
| 2,411,362 | Boykin | Nov. 19, 1946 |
| 2,474,988 | Sargrove | July 5, 1949 |
| 2,546,025 | Breimer | Mar. 20, 1951 |
| 2,718,623 | Yoder et al. | Sept. 20, 1955 |

FOREIGN PATENTS

| | | |
|---|---|---|
| 479,563 | France | Apr. 12, 1916 |
| 108,950 | Australia | Nov. 9, 1939 |

OTHER REFERENCES

Fleming Radio and Television News, November 1950, pages 55–58 and 180.